United States Patent [19]

Jaeger et al.

[11] Patent Number: 4,650,281
[45] Date of Patent: Mar. 17, 1987

[54] FIBER OPTIC MAGNETIC FIELD SENSOR

[75] Inventors: Raymond E. Jaeger; Mohd Aslami, both of Sturbridge, Mass.

[73] Assignee: SpecTran Corporation, Sturbridge, Mass.

[21] Appl. No.: 624,355

[22] Filed: Jun. 25, 1984

[51] Int. Cl.⁴ .................. G02B 6/22; G01C 1/10; G01N 27/72

[52] U.S. Cl. .................. 350/96.33; 350/96.10; 350/96.29; 350/96.30; 350/96.34; 356/149; 324/244; 324/260

[58] Field of Search .......... 350/96.10, 96.15, 96.16, 350/96.29, 96.30, 96.33, 96.34; 324/244, 246, 253, 258, 260, 261, 263; 356/149; 372/31, 32, 37

[56] References Cited

U.S. PATENT DOCUMENTS

| | | | |
|---|---|---|---|
| 3,445,666 | 5/1969 | Snaper | 350/96.29 |
| 3,701,131 | 10/1972 | Brauser et al. | 350/96.29 |
| 4,371,838 | 2/1983 | Griscom | 324/244 |
| 4,433,291 | 2/1984 | Yariv et al. | 350/96.29 |

OTHER PUBLICATIONS

Yariv et al., "Proposal for Detecting of Magnetic . . . Fibers", Optics Lett., vol. 5, No. 3, 3/80, pp. 87–89.
Dandridge et al., "Optical Fibre Magnetic Field Sensors", Electronics Lett. vol. 16, No. 11, 3/80.
Tangonan et al., "Current Sensing with Metal Coated . . . Fibres", Electronics Lett., 10/80.
Taylor et al., "Fiber Optic Sensors", Proceedings of 1st Eur Conf. on Int. Optics, 1981.
Giallorenzi, "Fibre Optic Sensors", Optics and Laser Technology, Apr. 1981, pp. 73–78.
Trowbridge et al., "Metallic–Glass Fiber-Optic Phase Modulators", Optics Lett, vol. 6, No. 12, 12/81, pp. 636–638.
Davis, "Introduction to Fiber Optic Sensors", Fiberoptic Technology, 2/82, pp. 112–115.

*Primary Examiner*—William L. Sikes
*Assistant Examiner*—Brian M. Healy
*Attorney, Agent, or Firm*—Pennie & Edmonds

[57] ABSTRACT

A magnetically sensitive optical fiber is described. Specifically, this fiber is comprised of a central core containing magnetostrictive material and an optical waveguide, having an optical ring core and inner- and outer-glass cladding layers, clad to the central core. The core is constructed from magnetostrictive material which is readily and inexpensively available as wire of various gauges. The wire is chosen to have a relatively large cross-sectional area with respect to that of the glass cladding layer(s). The resulting optical fiber is advantageously highly sensitive to weak magnetic fields and is also both simple and inexpensive to manufacture.

13 Claims, 2 Drawing Figures

FIBER OPTIC MAGNETIC FIELD SENSOR

BACKGROUND OF THE INVENTION

1. Field of the Invention

The present invention relates to magnetic field sensors and, more particularly, to a fiber optic sensor which is highly sensitive to an applied magnetic field.

2. Description of the Prior Art

It is well known that fiber optic magnetic field sensors can be fabricated by cladding magnetostrictive material onto a length of optical fiber. When all or a portion of such a clad fiber is exposed to a magnetic field, oriented in a direction substantially parallel to the longitudinal axis of the fiber, the magnetostrictive cladding changes its length (e.g. elongates) which, in turn, changes (e.g. increases) the length of the optical fiber. As the field strength increases, the elongation correspondingly increases. This elongation varies the phase angle of any light propagating down the fiber and, more specifically, through any stretched portion of the fiber. Consequently, any increase in the elongation correspondingly increases the phase angle variation. Hence, by measuring phase angle variations by, for example, an interferometric technique, wherein any phase shift existing in a magnetically sensitive optical fiber "sensing" arm is compared to that occurring in an optical fiber "reference" arm, an accurate determination of the magnetic field strength can be readily and accurately obtained. This concept is more fully described in the following references: A. Yariv et al., "Proposal for Detection of Magnetic Fields Through Magnetostrictive Perturbation of Optical Fibers", *Optics Letters*, Vol. 5, No. 3, March 1980, pages 87-89; A. Dandridge et al., "Optical Fibre Magnetic Field Sensors," *Electronics Letters*, Vol. 16, No. 11, May 22, 1980, pages 408-409; G. Tangonan et al., "Current Sensing With Metal-Coated Multi-Mode Optical Fibers," *Electronics Letters*, Vol. 16, No. 25, Dec. 4, 1980, pages 958-959; H. Taylor et al., "Fiber Optic Sensors," *Proceedings of the First European Conference on Integrated Optics* 1981, pages 99-101; T. Giallorenzi et al., "Fiber Optic Sensors," *Optics and Laser Technology*, April 1981, pages 73-78; F. Trowbridge et al., "Metallic-Glass Fiber-Optic Phase Modulators," *Optics Letters*, Vol. 6, No. 12, December 1981, pages 636-638; and C. Davis, "An Introduction to Fiberoptic Sensors," *Fiberoptic Technology*, February 1982, pages 112-115.

However, the above-described fiber optic magnetic field sensor possesses serious drawbacks. Specifically, in order to produce a sensor with a high sensitivity, i.e., one that is able to detect a weak magnetic field, the magnetostrictive cladding must have a certain minimum thickness. Disadvantageously, this thickness cannot be readily obtained unless sophisticated and costly deposition techniques are used to clad magnetostrictive material to the optical fiber. In addition, the fiber must undergo extensive high temperature annealing during its manufacture in order to properly orient the grains of magnetostrictive material in the cladding so as to impart the desired bulk magnetic properties to the magnetostrictive cladding.

SUMMARY OF THE INVENTION

Accordingly, it is an object of the present invention to provide a highly sensitive fiber optic magnetic field sensor which does not require a thick cladding layer.

Another object of the invention is to eliminate the need for sophisticated and/or expensive techniques for manufacturing the sensor.

A further object of the invention is to produce such a sensor having the desired optimum bulk magnetic properties without annealing the clad fiber.

These and other objects are achieved in accordance with the present invention by placing magnetostrictive material in the core of an optical fiber and cladding an optical waveguide, comprised of an optical ring core and inner- and outer-glass layers, to the magnetostrictive core.

Furthermore, in accordance with the preferred embodiment disclosed herein, electrical signals or power can be transmitted through the magnetostrictive core; while signals requiring a wide bandwidth, such as data, can optically propagate through the optical ring core.

BRIEF DESCRIPTION OF THE DRAWING

The invention may be clearly understood from a consideration of the following detailed description and accompanying drawing in which.

To facilitate easy understanding, identical reference numerals are used to denote identical elements common to the figures.

DETAILED DESCRIPTION

Figure 1:
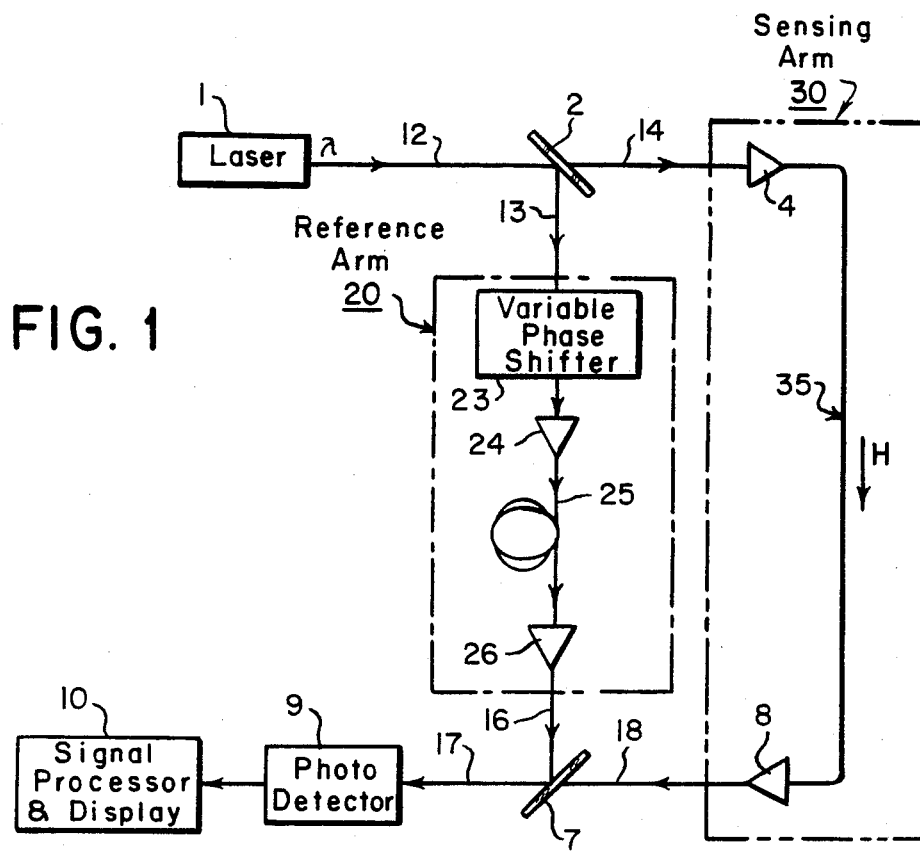
FIG. 1 is a block diagram of an interferometric system for detecting the presence of a magnetic field which utilizes a fiber optic magnetic field sensor that embodies the teachings of the present invention.

A system for detecting the presence of a magnetic field utilizing an optical fiber magnetic field sensor is shown in block diagram form in FIG. 1. This system relies upon the interferometric technique and employs the well-known Mach-Zehnder arrangement.

Specifically, laser 1 produces a coherent beam of light 12 of wavelength $\lambda$. This light is not limited to the visible spectrum, but can in fact exist in the non-visible spectrum (e.g. infra-red), if desired. Beam 12 strikes splitter 2, which, in response thereto, produces light beams 13 and 14. Light beam 13 is applied to reference arm 20, and light beam 14 is applied to sensing arm 30 which is itself comprised of optical fiber 35 and optical amplifiers 4 and 8. The reference arm imparts a predetermined phase shift to the light propagating through this arm. By contrast, the sensing arm imparts a variable phase shift to the light propagating through it wherein, more specifically, the phase shift varies proportionally in response to the intensity of applied magnetic field H which is oriented, as shown by the arrow, in a direction substantially parallel to the longitudinal axis of optical fiber 35 which forms part of sensing arm 30. In particular, the phase shift imparted by the reference arm is initially set to a value that will precisely match any phase shift produced by the sensing arm whenever the latter is in its normal state, i.e. not exposed to the magnetic field being detected or under test. This permits the value of magnetic field strength displayed by the system to be initially balanced or "nulled" to zero.

Optical light beams 16 and 18 produced by reference arm 20 and sensing arm 30, respectively, are both applied to combiner 7, which combines these beams into resultant beam 17. The resultant beam is applied to the input of photodetector 9 which converts the optical input into an electrical signal. This signal is, in turn, processed within signal processor and display 10 which first determines the phase shift of the light emanating from combiner 7 and then subtracts therefrom the predetermined phase shift imparted by reference arm 20 in order to determine the phase shift produced by sensing arm 30. Once this latter phase shift is determined, the value of the magnetic field corresponding thereto is displayed by signal processor and display 10.

Reference arm 20 typically contains means, which are well-known to the art, such as variable phase shifter 23, which can be adjusted to impart a pre-selected phase shift to light beam 13. The optical light output of variable phase shifter 23 is applied to optical amplifier 24 which, in turn, amplifies this light and thereafter applies it to one end, i.e., the input end, of a pre-selected length of single-mode optical fiber 25. This single-mode optical fiber, the so-called "reference fiber", imparts an additional fixed predetermined phase shift to the light beam propagating through it. This reference fiber is constructed such that it is not sensitive to any applied magnetic field. The phase shift produced by variable phase shifter 23 is initially set such that the total phase shift (i.e. sum of the individual phase shifts) produced by both variable phase shifter 23 and reference fiber 25 will precisely equal the phase shift produced by sensing arm 30 whenever it exists in its normal state. The light which appears at the other end, i.e., the output end, of reference fiber 25 is applied to optical amplifier 26 which, in turn, amplifies this light. The output of this amplifier, specifically light beam 16, is applied as one optical input to combiner 7.

Sensing arm 30 includes single-mode optical fiber 35 which contains magnetostrictive material. This fiber is sensitive to any magnetic field and particularly to one oriented substantially parallel to the longitudinal axis of this fiber. Specifically, the length of the fiber proportionally changes, e.g., elongates, in response and in proportion to any increase in the strength of the applied magnetic field H. This elongation changes the length of the optical path and, in so doing, imparts a phase change, i.e., phase modulates, the light propagating through optical fiber 35.

In the prior art, optical fiber 35 was typically comprised of an optical fiber core with a jacket, or cladding layer, of magnetostrictive material coaxially surrounding the core. Unfortunately, thick cladding layers were required to produce a magnetically sensitive optical fiber which was able to detect weak magnetic fields. Disadvantageously, thick cladding layers could not be readily obtained unless sophisticated and costly deposition techniques were used to clad the magnetostrictive material to the optical fiber core. In addition, extensive annealing of the resulting composite (clad) fiber was disadvantageously required to properly orient the grains of magnetostrictive material in the cladding layer so as to impart the desired bulk magnetic properties to the magnetostrictive cladding.

The present invention therefore is directed to an arrangement for a magnetically sensitive optical fiber which is advantageously sensitive to very weak magnetic fields and does not require either sophisticated and costly deposition techniques or any annealing to manufacture.

Figure 2:
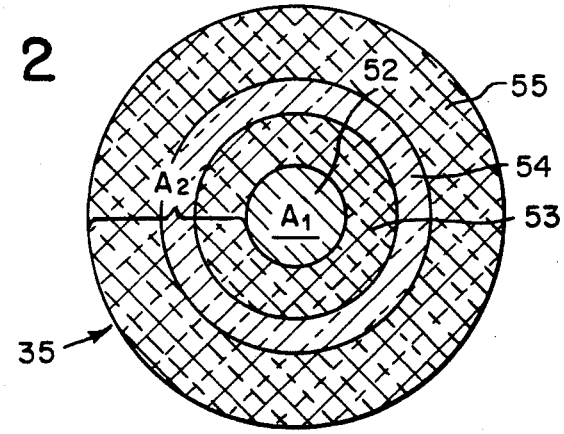
FIG. 2 is a cross-sectional view of a preferred embodiment of a magnetically sensitive optical fiber, which also incorporates the teachings of the present invention, and which can be used in the apparatus shown in FIG. 1.

A preferred dual core embodiment of a magnetically sensitive optical fiber, which embodies the teachings of the present invention and which can advantageously be used in the apparatus shown in FIG. 1, is shown in FIG. 2. As shown, central core 52 is comprised of a suitable magnetostrictive material, typified by iron, cobalt, nickel and various alloys and compounds thereof. Advantageously, these magnetostrictive materials are readily and inexpensively available in the form of wire of suitable gauge. Several glass cladding layers are concentrically clad to central core 52 to form an optical waveguide comprised of optical ring core 54 surrounded by inner-glass cladding layer 53 and outer-glass cladding layer 55. To ensure transmission of light through the ring core, the index of refraction of the optical ring core must be higher than that of each adjacent cladding layer. Magnetostrictive elongation of the core not only imparts a variable phase shift to the light propagating through the optical waveguide but also advantageously induces micro-bends onto the glass cladding layers which, in turn, advantageously decrease the amplitude of this light in the presence of a magnetic field. As the field strength increases, the number of applied micro-bends also increases. Hence, as the fiber elongates in the presence of a magnetic field, the resulting phase shift and amplitude loss both advantageously increase. Either or both of these effects can be used to sense magnetic field strength. Although the former (phase shift) effect is utilized in the well-known Mach-Zehnder arrangement shown in FIG. 1, many well-known arrangements can be fabricated which utilize the latter (micro-bend induced amplitude loss) effect.

The optical waveguide is first manufactured as a hollow optical waveguide preform using the "Inside-Tube CVD Technique" which is fully described in "Air Force Final Report on Concentric Core Fiber Development, Contract No. F19628-80-C-0200" and in Section 8.4.4, "Modified Chemical Vapor Deposition" of S. Miller et al, *Optical Fiber Telecommunications*, (c. 1979: Academic Press, New York). Alternatively, the hollow optical waveguide preform can be fabricated by successively depositing a series of cladding layers using the well known outside soot vapor deposition process as described, for example, in section 8.4.2, "Flame Hydrolysis (Soot) Techniques" of the same Miller et al textbook. Thereafter, the hollow preform is mounted in a suitable draw tower (not shown) and magnetostrictive wire is then inserted into the central opening in the preform. Both the wire and the glass are then simultaneously heated. This, in turn, causes the wire to expand in a length-wise direction and the optical preform to become quite plastic and completely collapse around the magnetostrictive wire. As a result, an optical waveguide (ring core and adjacent cladding layers) is concentrically formed around and coaxially oriented with the magnetostrictive wire which serves as core 52. As the fiber cools down to room temperature, the core contracts. Since the core material is chosen to have a higher thermal expansion coefficient value than any cladding layer(s), the contracting core places all the glass cladding layer(s) in compression. This advantageously increases the load bearing characteristic of the fiber, i.e., the amount of stress which the fiber can withstand before breaking, by balancing the stress levels to which the central core and the optical waveguide are subjected. The amount of compression that results is partially governed by the particular material used for the metallic core. With this technique, an intimate bond is created at the metal/glass interface which ensures that a sufficient amount of compression is imparted to the glass cladding layer by the contraction of the core.

Because magnetostrictive wire is readily available in a variety of different gauges which span a large range, the magnetostrictive material can be easily obtained with a relatively large diameter. By choosing a relatively large diameter wire, one can easily fabricate a magnetically sensitive optical fiber which will produce a significant change in length, e.g. elongation or contraction, in the glass cladding and, in turn, a large optical phase shift in the presence of a very weak magnetic field.

For the embodiment shown in FIG. 2, the metallic core 52 may be illustratively comprised of nickel wire, which possesses a negative magnetostrictive coefficient (i.e. this wire contracts in the presence of a magnetic field applied parallel to its axis) having a diameter of approximately 40 $\mu$m (micrometers or microns) with optical ring core 54 having a thickness of approximately 5-10 $\mu$m. Inner-glass cladding layer 53 has a thickness of approximately 25 $\mu$m, and outer-glass cladding layer 55 also has a thickness of approximately 25 $\mu$m. As previously noted, the glass compositions for the ring core, and inner- and outer-glass cladding layers are chosen such that the index of refraction of the ring core is higher than that of both the inner- and outer-glass cladding layers. A higher index of refraction for the ring core than for both adjacent glass cladding layers ensures that any light striking the boundary between the optical ring core and either the inner- or outer-glass cladding layer is totally internally reflected from the respective boundary into optical ring core. As a result, light propagates through optical ring core 54 with minimum attenuation. The index difference between the optical ring core and cladding layers, as well as the thickness of the optical ring core, can all be chosen such that only the lowest mode will propagate through the optical ring core, thereby yielding a single-mode fiber. Alternatively, these items can be chosen to permit propagation of multiple modes. In this latter case, fluctuations in the amplitude (intensity) of the light striking photo-detector 9, rather than phase shift fluctuations in this light, are monitored to determine magnetic field strength. A protective layer (not shown) comprised of compositions well-known to the art is concentrically applied over outer-glass cladding layer 55, using illustratively well-known polymeric coating techniques. This protective layer provides adequate protection for the fiber against abrasion, caustic environments, and similar adverse environmental affects.

Of course, it would be appreciated by those skilled in the art that both optical and electrical signals can be simultaneously transmitted through the inventive magnetostrictive optical fiber described hereinabove. Specifically, signals such as data, which require a wide bandwidth, can be transmitted as optical signals which propagate through the optical ring core. High current low bandwidth signals, such as power and/or control signals, can be advantageously transmitted in electrical form through magnetostrictive core 52.

Furthermore, the central core of a magnetically sensitive optical fiber, constructed in accordance with the teachings of this invention, is not limited to having only a circularly shaped cross-section. Advantageously, the cross-sectional shape of the core can take on any closed shape, illustratively square, rectangualar, triangular or oval. Such an optical fiber with a rectangular cross-section of appropriate dimensions (width much greater than height, for example) could find particular use in those applications which cannot accommodate an optical fiber having a relatively large diameter.

Although a specific illustrative embodiment has been shown and described herein, this merely illustrates the principles of the present invention. Many and varied arrangements embodying these principles may be devised by those skilled in the art without departing from the spirit and scope of the invention.

What is claimed is:

1. A magnetically sensitive optical fiber comprising:
   a central core comprised of a magnetostrictive metal wire, and
   a plurality of separate glass cladding layers, concentrically clad around the central core, which forms a light-transmissive optical waveguide having an optical ring core surrounded by separate inner- and outer-glass cladding layers wherein the index of refraction of the ring core is higher than that of both the inner- and outer-glass cladding layers.

2. The fiber in claim 1 wherein the central core is comprised of an alloy having at least one of the following elements from the group consisting of iron, nickel and cobalt.

3. The fiber in claim 2 wherein the alloy is substantially comprised of one of the following elements from the group consisting of iron, nickel and cobalt.

4. The fiber in claim 3 wherein the central core has a substantially circular cross-section.

5. The fiber in claim 1 wherein the central core is chosen to have a higher thermal expansion coefficient value than that of any of the glass cladding layers.

6. The fiber in claim 5 wherein the glass cladding layers normally exist in a state of compression at room temperature.

7. The fiber in claim 6 wherein the central core is substantially comprised of an alloy having at least one of the following elements from the group consisting of iron, nickel and cobalt.

8. The fiber in claim 7 wherein the central core has a substantially circular cross-section.

9. A magnetically sensitive optical fiber comprising:
   a central core of a magnetostricitive metal wire; and
   a light-transmissive optical waveguide comprising:
      a first glass cladding layer concentrically clad around the central core;
      an optical ring core concentrically clad around the first glass cladding layer; and
      a second glass cladding layer concentrically clad around the second glass cladding layer;
   wherein the index of refraction of the ring core is higher than that of either the first or second glass cladding layers.

10. The fiber in claim 9 wherein the central core wire comprises iron, nickel, cobalt or alloys thereof.

11. The fiber in claim 10 wherein the central core has a substantially circular cross-section.

12. The fiber in claim 11 wherein the glass cladding layers normally exist in a state of compression at room temperature.

13. A magnetically sensitive optical fiber consisting essentially of:
   a central core of a metal wire consisting of iron, nickel, cobalt or alloys thereof;
   a light-transmissive optical waveguide comprising:
      a first glass cladding layer concentrically clad around the central core;
      an optical ring core concentrically clad around the first glass cladding layer; and
      a second glass cladding layer concentrically clad around the second glass cladding layer;
   wherein the index of refraction of the ring core is higher than that of either the first or second glass cladding layers.

* * * * *